United States Patent
Dittmer

(10) Patent No.: US 7,391,261 B2
(45) Date of Patent: Jun. 24, 2008

(54) ENHANCED BANDWIDTH ENVELOPE ELIMINATION AND RESTORATION

(75) Inventor: Timothy Wilfred Dittmer, Mason, OH (US)

(73) Assignee: Harris Corporation, Melbourne, FL (US)

(*) Notice: Subject to any disclaimer, the term of this patent is extended or adjusted under 35 U.S.C. 154(b) by 0 days.

(21) Appl. No.: 11/305,649

(22) Filed: Dec. 16, 2005

(65) Prior Publication Data
US 2007/0139107 A1   Jun. 21, 2007

(51) Int. Cl.
*H03G 3/20* (2006.01)
(52) U.S. Cl. .......................... 330/136; 330/297
(58) Field of Classification Search ............... 330/10, 330/127, 129, 136, 297
See application file for complete search history.

(56) References Cited

U.S. PATENT DOCUMENTS

| | | | |
|---|---|---|---|
| 5,936,464 A * | 8/1999 | Grondahl .................... 330/136 |
| 6,175,273 B1 * | 1/2001 | Sigmon et al. .............. 330/136 |
| 6,486,733 B2 | 11/2002 | Myers et al. ................. 330/10 |
| 6,583,664 B2 * | 6/2003 | Mathe et al. ................ 330/136 |
| 6,624,711 B1 | 9/2003 | Khan et al. .................. 332/106 |
| 6,624,712 B1 | 9/2003 | Cygan et al. ................ 332/106 |
| 2002/0193085 A1 | 12/2002 | Mathe et al. |
| 2004/0008081 A1 | 1/2004 | Friedel et al. |
| 2004/0043735 A1 | 3/2004 | Grosspietsch et al. |
| 2004/0052312 A1 | 3/2004 | Matero |

* cited by examiner

*Primary Examiner*—Khanh V Nguyen
(74) *Attorney, Agent, or Firm*—Tarolli, Sundheim, Covell & Tummino LLP

(57) ABSTRACT

Systems and methods are provided for amplifying a composite input signal, comprising a drive signal and an envelope signal, at a power amplifier. A secondary modulation, representing a portion of the composite input signal falling outside of a frequency band associated with the envelope signal, is produced for the drive signal. The secondary modulation is applied to the drive signal. The drive signal is amplified at the power amplifier to produce an amplified signal. At least a portion of the envelope signal is employed to drive a supply terminal of the power amplifier.

15 Claims, 2 Drawing Sheets

ENHANCED BANDWIDTH ENVELOPE ELIMINATION AND RESTORATION

TECHNICAL FIELD

The present invention relates to radio frequency communication systems and is particularly directed to systems and methods for amplifying a signal.

BACKGROUND OF THE INVENTION

RF power amplifiers used for wireless communication transmitters require high linearity to preserve modulation accuracy and to limit spectral regrowth. Linear amplifiers are capable of electrical (DC power in to RF power out) efficiencies greater than fifty percent when operated at saturation. However, they are generally not operated at an optimal level of efficiency due to the need to provide high linearity. For constant envelope waveforms, linear amplifiers are often operated below saturation to provide for operation in their linear region. Time varying envelopes present an additional challenge.

One technique for enhancing the efficiency of an amplifier system is Envelope Elimination and Restoration (EER). The EER technique detects the envelope of the incoming signal to produce an amplitude modulated (AM) component of the incoming signal and a phase modulated (PM) component with a constant envelope. The PM signal component is provided to the input of the power amplifier along a PM path and the AM component is employed to modulate the supply of the power amplifier along an AM path. Since the signal input into the power amplifier has a constant amplitude envelope, a more efficient class of power amplifier can be employed to amplify the input signal. Additionally, since the supply signal changes with the desired power of the amplified signal, the amplifier can be operated at compression enhancing the efficiency of the amplifier.

SUMMARY OF THE INVENTION

In accordance with an aspect of the present invention, a method is provided for amplifying a composite input signal, comprising a drive signal and an envelope signal, at a power amplifier. A secondary modulation representing, a portion of the composite input signal falling outside of a frequency band associated with the envelope signal, is produced for the drive signal. The secondary modulation is applied to the drive signal. The drive signal is amplified at the power amplifier to produce an amplified signal. At least a portion of the envelope signal is employed to drive a supply terminal of the power amplifier.

In accordance with another aspect of the present invention, an envelope elimination and restoration system having enhanced bandwidth is provided. An envelope detector separates an input signal into an envelope signal and a drive signal. A separation component extracts a first signal component, comprising a portion of the signal falling within a frequency band associated with the system, and a second signal component, comprising a portion of the signal falling outside of the frequency band, from the envelope signal. A secondary modulation component applies the second signal component to the drive signal as a secondary modulation that includes at least a small signal amplitude modulation. A power amplifier receives the modulated drive signal at a gate or base terminal and a representation of the first signal component at a supply terminal and produces an amplified representation of the input signal.

In accordance with yet another aspect of the present invention, an amplifier system is provided for amplifying a composite input signal, comprising a drive signal and an envelope signal. A modulation component applies a precorrection to the drive signal as a secondary modulation. The secondary modulation includes a small signal amplitude modulation component. A power amplifier receives the modulated drive signal at a gate or base terminal and at least a portion of the envelope signal at a supply terminal. The power amplifier produces an amplified representation of the input signal.

BRIEF DESCRIPTION OF THE DRAWINGS

The foregoing and other features of the present invention will become apparent to those skilled in the art to which the present invention relates upon consideration of the following description of the invention with reference to the accompanying drawings, wherein.

DESCRIPTION OF THE PREFERRED EMBODIMENT

Figure 1:
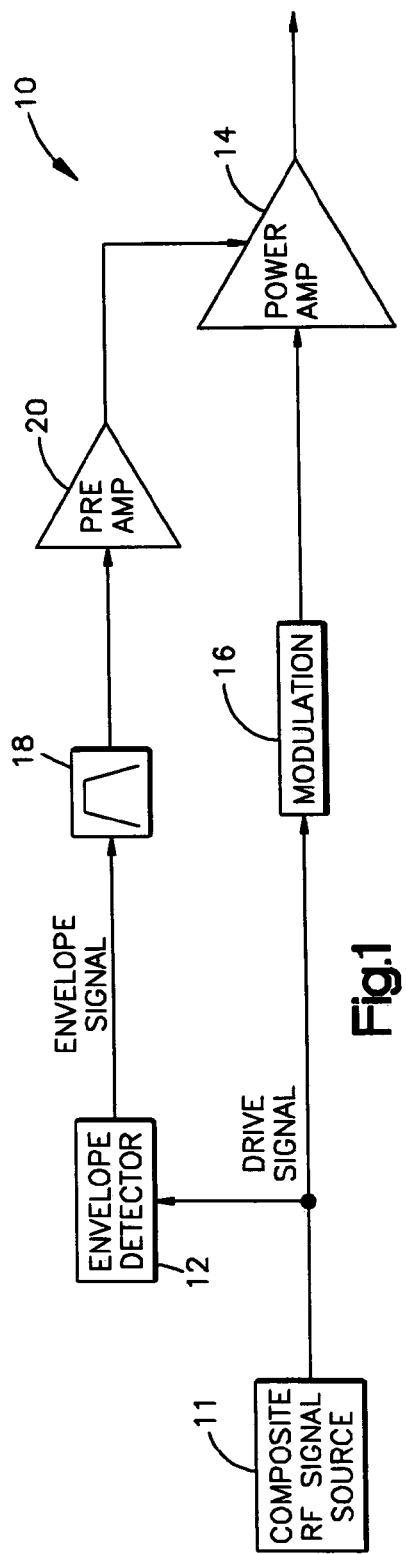
FIG. 1 illustrates a functional block diagram of an envelope elimination and restoration system in accordance with an aspect of the present invention.

FIG. 1 illustrates a functional block diagram of an amplifier system 10 in accordance with an aspect of the present invention. The system 10 produces a radio frequency (RF) signal at an composite RF signal source 11. The RF signal is provided to an envelope detector 12 that produces an envelope signal associated with the power amplifier. A drive signal associated with the power amplifier can be produced via an appropriate means for the application (e.g., through use of a limiter). It will be appreciated that the input signal can include amplitude modulation, frequency modulation, phase modulation, or any combination thereof. In accordance with an aspect of the present invention, the input signal can contain various predistortion products necessary to compensate for distortion introduced by a power amplifier 14 associated with the system 10.

A derivative signal (e.g., a precorrection signal) associated with the power amplifier 14 can be incorporated in the drive signal as a secondary modulation at a small-signal modulation component 16. For example, the derivative signal can represent a portion of the signal that falls outside of a desired frequency band of the power amplifier. The derivative signal can be determined and applied directly to the drive signal or can be extracted from the envelope signal via complementary bandpass and bandstop filters. The secondary amplitude modulation can be accomplished by any appropriate means, such as direct modulation (e.g., mixing) of the signal or applying the secondary modulation to the gate or base inputs of the power amplifier 14. It will be appreciated that the secondary modulation can include a small signal component as well as a phase or frequency component. Maintaining this secondary modulation at a low amplitude allows it to have a minimal effect on the operating point and efficiency of the power amplifier.

The envelope signal is filtered at a bandpass filter 18 and amplified at a preamplifier 20. The drive signal is then amplified at the power amplifier 14 using the envelope signal as a supply input. It will be appreciated that since substantially all of the out-of-band information is applied to the drive signal, the bandwidth of the envelope signal can be limited. Accordingly, the effective bandwidth of the envelope elimination and restoration system 10 is expanded.

Figure 2:
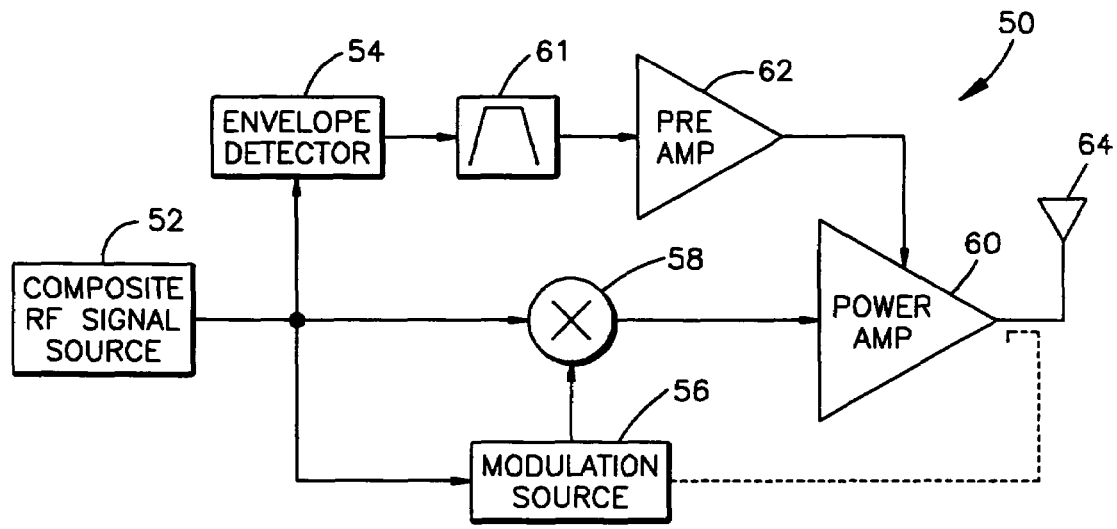
FIG. 2 illustrates an exemplary transmitter system utilizing envelope elimination and restoration in accordance with an aspect of the present invention.

FIG. 2 illustrates an exemplary transmitter system 50 utilizing envelope elimination and restoration in accordance with an aspect of the present invention. The transmitter 50 includes a composite radio frequency (RF) signal source 52 that provides a composite RF signal to be amplified. For example, the signal source 52 can provide a vector modulated RF signal. It will be appreciated that the illustrated system is merely exemplary and that the present invention can be used with a variety of modulation schemes, including purely AM and FM signals. In the case of an FM signal, the amplitude modulation applied to the signal can be used to include additional information in the signal (e.g., in an in-band, on-channel (IBOC) arrangement).

The RF signal is provided to an envelope detector 54. The envelope detector 54 separates an envelope signal that reflects the amplitude modulation within the RF signal from a drive signal that contains the frequency and phase modulation associated with the RF signal. The drive signal is then provided to a modulation source 56 that provides a secondary modulation to the RF signal. The secondary modulation can include one or more of a small signal amplitude component and a phase or frequency component. For example, the modulation source 56 can include a precorrection component that calculates a desired precorrection for the input signal. Alternatively, the modulation source 56 can include a digital exciter that provides a low-amplitude digital signal for inclusion in the RF signal as part of an in-band, on-channel (IBOC) arrangement. It will be appreciated that the precorrection component 56 can receive other inputs, such as a signal representing the amplifier output. In accordance with an aspect of the present invention, the precorrection can be calculated as to be applied directly to the drive signal, as opposed to the composite input signal.

The calculated precorrection can then be applied to the drive signal at a mixer 58. It will be appreciated that the precorrection will be amplified along with the drive signal, such that the calculated precorrection can be applied as a small signal to avoid negatively impacting the efficiency of the envelope elimination and restoration system 50. The modulated signal is then provided as a gate input to the power amplifier 60.

The envelope signal is provided to a bandpass filter 61 that eliminates a portion of the envelope signal that falls outside of a frequency band associated with the power amplifier. The filtered signal is then provided to a preamplifier 62 that amplifies the envelope signal to an appropriate voltage for use as a supply input for the power amplifier 60. The power amplifier 60 amplifies the precorrected drive signal according to the envelope signal provided to the supply input to produce a composite output signal that is substantially free of distortion. The output signal is then broadcast at an antenna 64.

Figure 3:
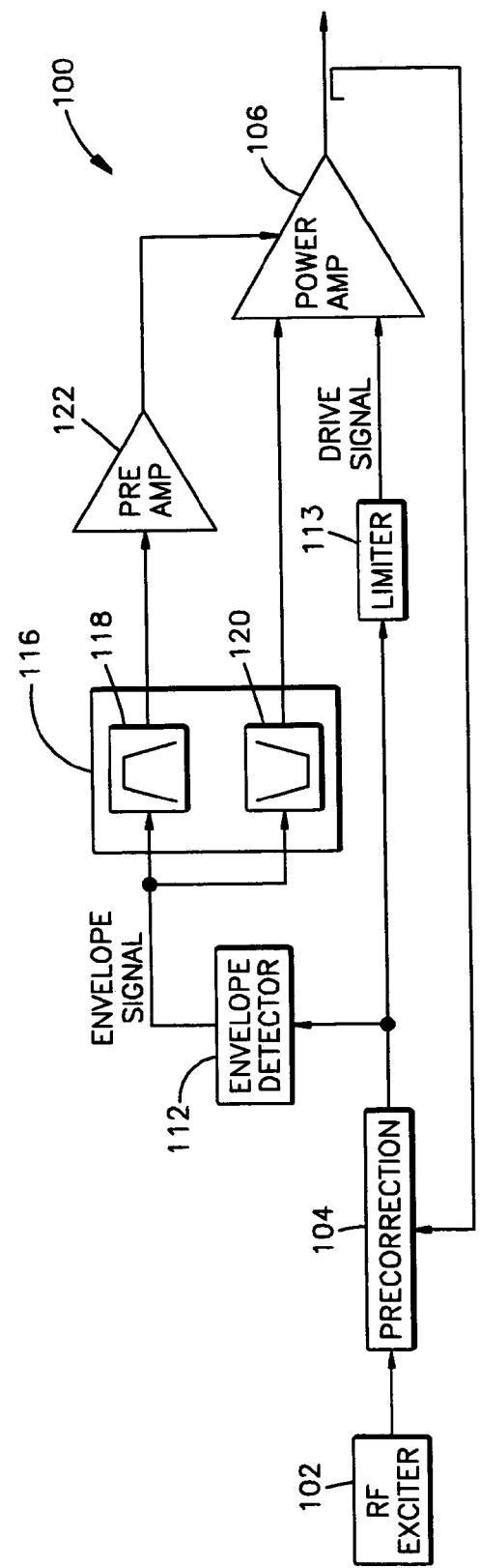
FIG. 3 illustrates a functional block diagram of an exemplary envelope elimination and restoration system in accordance with an aspect of the present invention.

FIG. 3 illustrates a functional block diagram of an exemplary envelope elimination and restoration system 100 in accordance with an aspect of the present invention. The system 100 produces a radio frequency (RF) signal at an RF exciter 102. The RF signal is provided to a precorrection calculation component 104 that provides an appropriate precorrection for the input signal, according to known distortion properties of a power amplifier 106 associated with the system. The precorrection is calculated such that the distortion applied by the power amplifier 106 will substantially cancel the applied precorrection, leaving an amplified representation of the input signal. It will be appreciated that the applied predistortion will, in general, have a reduced power relative to the total power of the signal.

In accordance with an aspect of the present invention, the precorrection component 104 can be made adaptive, such that the precorrection component continuously provides an appropriate precorrection for the input signal based upon a comparison of a buffered input signal and a sampled output of the power amplifier 106. The adaptive predistortion allows the system to maintain an appropriate precorrection in response to variance in the behavior of the power amplifier caused by age, changes in temperature, and other factors.

The precorrected input signal is then provided to an envelope detector 112 and a limiter 113. The envelope detector 112 and the limiter 113 separate the input signal into two components, a comparatively low frequency envelope signal, and a comparatively high frequency drive signal. The envelope signal is provided to a separation component 116, comprising a bandpass filter 118 and a bandstop filter 120. The bandpass filter 118 is configured to pass an associated frequency band of the input signal. The majority of the power associated with the input signal will be contained in this band. The output of the bandpass filter 118 is provided to a preamplifier 122 to produce a power supply voltage for the system. The bandstop filter 120 eliminates a portion of the signal falling within the frequency band. The output of the bandstop filter 120 contains at least a portion of the relatively low power predistortion products, which will generally fall outside of the associated frequency band of the signal.

The output of the bandstop filter 120 can be incorporated into the drive signal as a secondary modulation. In the exemplary implementation, the predistortion products can be applied to the gate or base bias of the power amplifier 106 or the preamplifier 122. Since this secondary modulation can be very small, it has a minimal effect on the operating point and efficiency of the power amplifier. The drive signal is then amplified at the power amplifier 106 using the envelope signal as a supply input.

Figure 4:
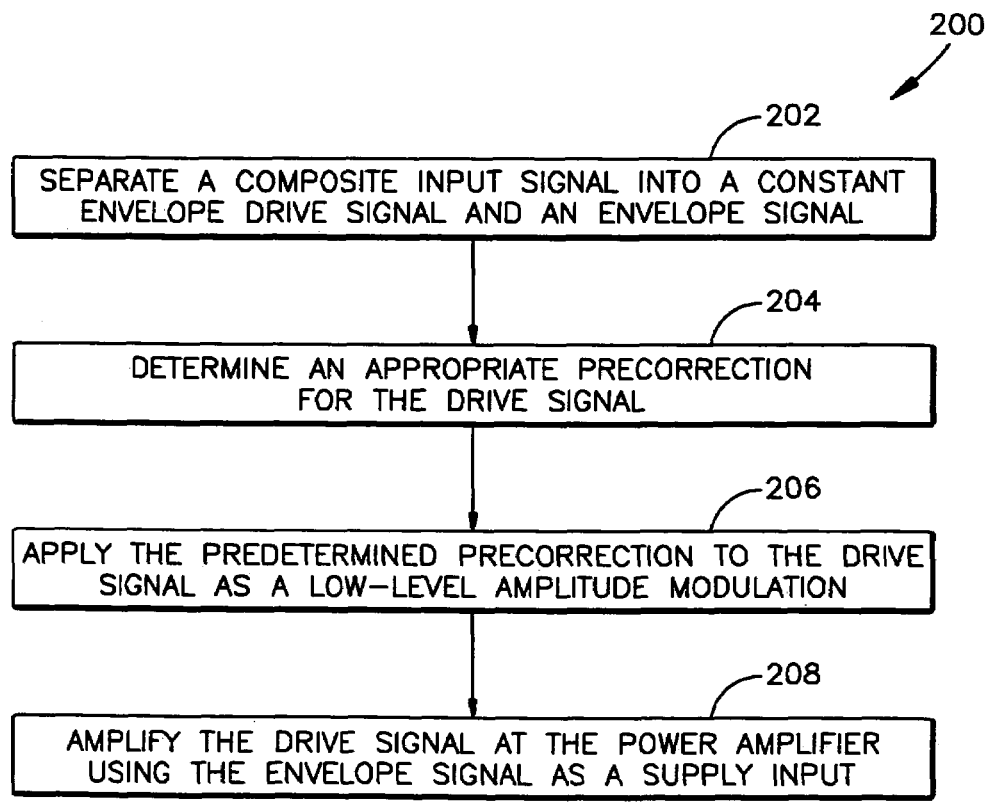
FIG. 4 illustrates a methodology for amplifying a radio frequency input signal in accordance with an aspect of the present invention.

FIG. 4 illustrates a methodology 200 for amplifying a radio frequency input signal in accordance with an aspect of the present invention. At step 202, the radio frequency input signal is separated into an envelope signal and a constant envelope drive signal. At step 204, an appropriate precorrection for the drive signal can be determined. For example, a precorrection can be calculated for the drive signal according to known properties of an associated power amplifier and the RF input signal. Alternatively, the precorrection can be added into the signal prior to the envelope separation, and a portion of the envelope signal that is outside of a frequency band associated with the signal (and thus likely to contain the precorrection information) can be separated from the envelope signal and adapted for use as precorrection information.

The precorrection information is incorporated into the drive signal as a small signal amplitude modulation at step 206. This can be accomplished by any appropriate means for modulating a constant envelope signal, including direct modulation (e.g., mixing) of the signal or applying the determined precorrection to the gate or base inputs of the power amplifier. The precorrected drive signal is then amplified at step 208, using the envelope signal as a supply input to the power amplifier.

From the above description of the invention, those skilled in the art will perceive improvements, changes, and modifications. Such improvements, changes, and modifications within the skill of the art are intended to be covered by the appended claims.

Having described the invention we claim:

1. A method for amplifying a composite input signal, comprising a drive signal and an envelope signal, at a power amplifier, comprising:
   deriving a signal from the envelope signal representing a portion of the composite input signal falling outside of a frequency band associated with the envelope signal;
   applying the derived signal to the drive signal as an amplitude modulation prior to providing the drive signal to the power amplifier; and
   amplifying the drive signal at the power amplifier to produce an amplified signal, such that at least a portion of the envelope signal is employed to drive a supply terminal of the power amplifier.

2. The method of claim 1, wherein applying the derived signal to the drive signal includes applying the derived signal to a gate terminal of the power amplifier.

3. The method of claim 1, wherein deriving a signal from the envelope signal includes the steps of:
   calculating precorrection information based on at least one characteristic of the power amplifier;
   combining the precorrection information with the input signal;
   filtering the envelope signal into an in-band portion and an out-of-band portion; and
   utilizing the out-of-band portion of the envelope signal as the derived signal.

4. The method of claim 3, wherein producing the secondary modulation for the drive signal includes the steps of:
   comparing the amplified signal to the input signal; and
   calculating a predistortion signal for the drive signal according to the comparison between the amplified signal and the input signal.

5. The method of claim 1, wherein the input signal is a vector modulated radio frequency (RF) signal.

6. An envelope elimination and restoration system having enhanced bandwidth, comprising:
   an envelope detector that separates an input signal into an envelope signal and a constant envelope drive signal;
   a separation component that extracts a first signal component, comprising a portion of the envelope signal falling within a frequency band associated with the system, and a second signal component, comprising a portion of the envelope signal falling outside of the frequency band, from the envelope signal;
   a power amplifier that receives the constant envelope drive signal at one of a gate terminal and a base terminal and a representation of the first signal component at a supply terminal; and
   a modulation component that applies the second signal component to one of the gate terminal and the base terminal, the power amplifier producing an amplified representation of the input signal from the representation of the first signal component, the second signal component, and the constant envelope drive signal.

7. The system of claim 6, further comprising a precorrection component that calculates an appropriate precorrection for the input signal and applies the precorrection to the input signal such that at least a portion of the second signal component is comprised of the applied precorrection.

8. The system of claim 7, wherein the precorrection component is adaptive, such that it utilizes at least a portion of the input signal and the amplified representation of the input signal to calculate an appropriate precorrection.

9. The system of claim 6, the separation component comprising a bandpass filter that outputs the first signal component and a bandstop filter that outputs the second signal component.

10. An amplifier system for amplifying a composite input signal, comprising a drive signal and an envelope signal, comprising:
    a separation component that extracts a first signal component, comprising a portion of the envelope signal falling within a frequency band associated with the system, and a second signal component, comprising a portion of the envelope signal falling outside of the frequency band, from the envelope signal;
    a power amplifier that receives the drive signal at one of a gate terminal and a base terminal and the first signal component at a supply terminal; and
    a modulation component that applies a precorrection derived from the second signal component to one of the drive signal as a secondary modulation comprising a low-level amplitude modulation and the gate terminal of the power amplifier, such that the power amplifier produces an amplified representation of the input signal from the first signal component, the second signal component, and the drive signal.

11. An envelope elimination and restoration system comprising the system of claim 10.

12. The system of claim 10, further comprising an envelope detector that extracts the envelope signal from a composite input signal and a limiter that extracts the drive signal from the composite input signal.

13. The system of claim 10, the separation component comprising a bandpass filter that outputs the first signal component and a bandstop filter that outputs the second signal component.

14. The system of claim 10, further comprising a precorrection component that calculates the precorrection according to at least one characteristic of the power amplifier.

15. The system of claim 14, wherein the precorrection component is adaptive, such that it utilizes at least a portion of the input signal and the amplified representation of the input signal to calculate the precorrection.

* * * * *